(12) United States Patent
Peleato-Inarrea et al.

(10) Patent No.: US 8,856,616 B1
(45) Date of Patent: Oct. 7, 2014

(54) TWO DIMENSIONAL ENCODING FOR NON-VOLATILE MEMORY BLOCKS

(75) Inventors: Borja Manuel Peleato-Inarrea, Menlo Park, CA (US); Andrei Eugenievich Vityaev, San Jose, CA (US); Nenad Miladinovic, Campbell, CA (US)

(73) Assignee: Proton Digital Systems, Inc., San Jose, CA (US)

( * ) Notice: Subject to any disclaimer, the term of this patent is extended or adjusted under 35 U.S.C. 154(b) by 23 days.

(21) Appl. No.: 13/556,088

(22) Filed: Jul. 23, 2012

Related U.S. Application Data

(60) Provisional application No. 61/513,510, filed on Jul. 29, 2011.

(51) Int. Cl.
*G11C 29/00* (2006.01)
(52) U.S. Cl.
USPC .............................. 714/763; 714/773; 714/732
(58) Field of Classification Search
CPC .................... G06F 11/1076; G06F 11/1008
USPC ................. 714/763, 733, 773, 732, 710, 752
See application file for complete search history.

(56) References Cited

U.S. PATENT DOCUMENTS

| | | | | |
|---|---|---|---|---|
| 7,647,536 B2 * | 1/2010 | Dempsey et al. | ............. | 714/711 |
| 8,132,061 B2 * | 3/2012 | Dempsey et al. | ............. | 714/710 |
| 8,615,700 B2 * | 12/2013 | Dave et al. | ................... | 714/773 |

OTHER PUBLICATIONS

Hu, X-Y et al., "Efficient Implementations of the Sum-Product Algorithm for Decoding LDPC Codes," IEEE, pp. 1036-1036E (2001).
Kim, C. et al., "Product Reed-Solomon Codes for Implementing NAND Flash Controller on FPGA chip," IEEE Computer Society, pp. 281-285 (2010).
Richardson, T. et al., "Efficient Encoding of Low-Density Parity-Check Codes," pp. 1-42 (Mar. 6, 2001).
Yang, C. et al., "Flexible Product Code-Based ECC Schemes for MLC NAND Flash Memories," IEEE Workshop on Signal Processing Systems, pp. 1-6 (Oct. 4, 2011).

* cited by examiner

*Primary Examiner* — Fritz Alphonse
(74) *Attorney, Agent, or Firm* — Bardmesser Law Group

(57) ABSTRACT

Method for encoding information in a flash memory block which combines an independent encoding of each page with a block-level code across multiple pages. The method includes two independent error correction codes, one in horizontal direction and one in vertical direction, with horizontal direction error correction decoding; and vertical direction erasure correction decoding.

14 Claims, 4 Drawing Sheets

TWO DIMENSIONAL ENCODING FOR NON-VOLATILE MEMORY BLOCKS

CROSS-REFERENCE TO RELATED APPLICATIONS

This application is a non-provisional of U.S. Provisional Patent Application No. 61/513,510, filed on Jul. 29, 2011, which is incorporated by reference herein in its entirety.

BACKGROUND OF THE INVENTION

1. Field of the Invention

The invention is related to the non-volatile memory controller technology and more particularly to the encoding of the information during the write process and error correction during the read process from such memory.

2. Description of the Related Art

The main challenges of NAND Flash Memory are its higher cost relative to Hard-Disk-Drive storage, slow sequential write time, limited endurance (defined as the maximum number of Program/Erase cycles) and limited high temperature data retention time. These challenges are inter-related: in order to improve cost, one must use higher-density (more bits per cell) Flash, which in turn worsens its endurance and data retention. As an example, SLC (single level charge) Flash is typically rated for 100K or 50K P/E (Program/Erase) cycles and 2-bit per cell MLC (multiple level charge) Flash is typically rated for 10K, 5K or even as few as 3K P/E cycles.

Therefore, there is a need in the art for a method and system that provide for the improved reliability in reading and recovering data from the Flash memories.

SUMMARY OF THE INVENTION

The present invention is directed to a method and system of using two independent error correcting codes in improving the Flash memory reliability that substantially overcomes disadvantages of the related art.

The invention described herein is a novel information encoding scheme that allows the data to be recovered after being corrupted by high levels of noise and read-back signal distortion. In other words, in a situation where the conventional read operation would fail (due to too many read errors exceeding the capability of the error correction code), the proposed memory device would read the data successfully and error-free. This allows one to either increase the maximum allowable number of P/E cycles, or increase the maximum rated temperature and hours of guaranteed data retention. Alternatively, this can be used to lower the cost of Flash memory, by using the higher-density Flash memory without incurring in the accompanying endurance and data retention issues.

The invention allows the data to be read in the presence of lower Signal-to-Noise (SNR) ratio, regardless of where the lower SNR comes from. The disturbance mechanisms addressed by this invention include inter-cell interference, read disturbance, erratic over-programming, high temperature retention loss, low temperature retention loss, high number of Program/Erase cycles, coarse (faster) write, coarse (faster) read operations and error floor of the LDPC (Low Density Parity Check) codes.

The basic unit for read and write operations in flash memories is called a page. Traditionally, each page in a flash memory block is encoded independently so that they can be decoded as they are being read without additional read operations. However, the aggressive scaling of the technology has reduced the reliability of the read values. Manufacturers are now struggling with an increasingly large number of bit errors and require powerful error correction codes, which in turn reduce the power efficiency and throughput of the memory.

Before a page can be written, it needs to be erased. The basic unit for erase operations in flash memories is called a block. A block groups multiple adjacent pages that must be erased simultaneously. This application describes an error correction scheme where the page-level (horizontal direction) encoding is combined with an additional independent encoding across all the pages in a block (vertical direction). This vertical encoding can significantly reduce the probability of unrecoverable errors, with a very low memory and complexity overhead cost. The amount of redundancy in both codes can be changed depending on the desired trade-off between efficiency and reliability.

To simplify the encoding and decoding, both the horizontal and the vertical code generally have multiple independent codes concatenated in parallel. In this case each user information bit is mapped to two codewords: one horizontal (from the page-level code) and one vertical (from the block level code). In practice, it is common that specific bit lines get corrupted, causing errors in the same bit position across all the pages in the block. If many of these errors were to fall on the same codeword, recovery would be very difficult. In order to avoid this, it is recommended to map the bits to the vertical codewords in such a way that two bits occupying the same position in different pages are not assigned to the same codeword. For example, this could be achieved with the diagonal mapping in FIG. 4.

For most page reads, the horizontal page-level code will be enough to correct any errors that might arise, and the vertical block-level encoding will be ignored. Only on those rare occasions in which the decoding of the page fails, it will be necessary to read additional pages and decode the vertical code. If this also fails, a joint decoding of both vertical and horizontal codes could be attempted.

Additional features and advantages of the invention will be set forth in the description that follows, and in part will be apparent from the description, or may be learned by practice of the invention. The advantages of the invention will be realized and attained by the structure particularly pointed out in the written description and claims hereof as well as the appended drawings.

It is to be understood that both the foregoing general description and the following detailed description are exemplary and explanatory and are intended to provide further explanation of the invention as claimed.

BRIEF DESCRIPTION OF THE ATTACHED DRAWINGS

The accompanying drawings, which are included to provide a further understanding of the invention and are incorporated in and constitute a part of this specification, illustrate embodiments of the invention and together with the description serve to explain the principles of the invention.

DETAILED DESCRIPTION OF EMBODIMENTS OF THE INVENTION

Reference will now be made in detail to the preferred embodiments of the present invention, examples of which are illustrated in the accompanying drawings.

The invention described herein is a novel method of improving the reliability of the data read from the Non-Volatile Memory device that uses coding and signal processing algorithms for recovering of the data. The invention is described using the example of NAND Flash Memory but can be used for any block-level access memory device such as Phase Change Memory, MRAM, STT-MRAM, Resistive-RAM, etc. The invention described in this application uses the two independent error correction codes to improve overall reliability of the Flash memory by employing one error correction code in horizontal direction (pages) and second error correction code in the vertical direction (block).

Figure 1:
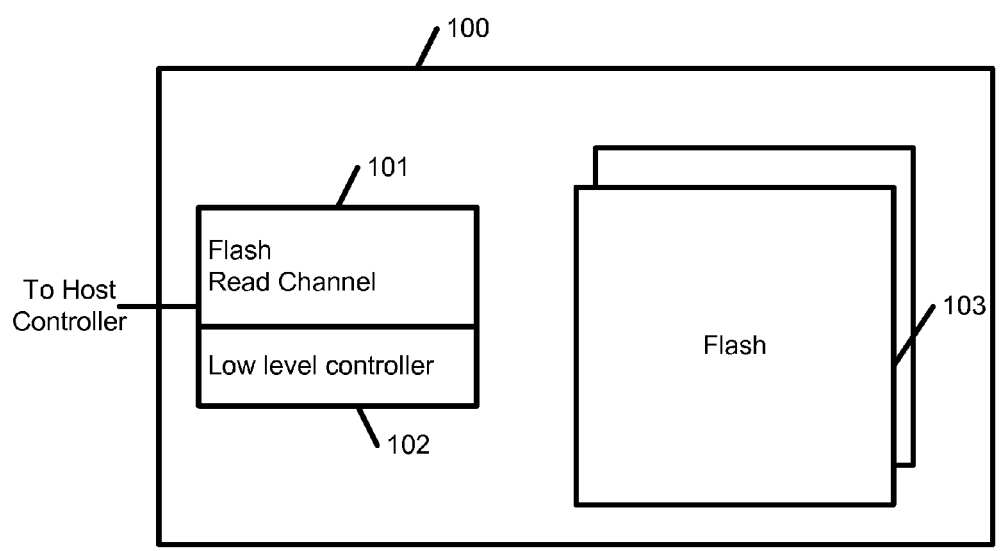
FIG. 1 shows a diagram of an embedded memory package incorporating a flash controller IC and a plurality of flash chips.

The key algorithms used by the proposed invention are implemented in a digital block called "Flash Read Channel" which is implemented inside a Flash Controller. The Flash Controller here can mean any of the following: Solid-State-Drive Controller IC, Flash Card Controller IC, USB Drive Controller IC. The overall system configuration is shown in FIG. 1.

The algorithm for error recovery described in this invention divides the parity bits allocated for redundancy between two different codes with aim to reduce the overall parity allocation necessary to achieve desired performance. The horizontal direction ECC code is used to encode user data stored in each page, and it is the primary error correction scheme for the error recovery in Flash memory. The horizontal direction ECC code can be any linear ECC code. In this application, we propose but not limit the horizontal direction ECC code to be LDPC code since the class of LDPC codes is known to be one of the best ECC codes providing great error correction capability (although the invention is not limited to this scheme). The vertical code is a secondary error correction code with much smaller error correction capability. The vertical direction ECC code can also be any linear ECC code.

On those rare occasions where the horizontal ECC code fails, the decoder of the horizontal code "flags" all the bits of the failed codeword, and/or all the bits of the page which contain the failed codeword, as "erasures". The "erasure" is a special symbol interpreted by the erasure decoder of the vertical code. It is an inherent property of all linear block codes that they can correct twice as many erasures than errors, see S. Lin and D. J. Costello, *Error control coding*, Prentice-Hall (2004). The invention described herein relies on the above mentioned fundamental property of linear codes to improve the error correction capability of the vertical code by utilizing the information about erasures provided by the horizontal ECC code.

An implementation of the invention on a NAND flash memory that uses the LDPC code as horizontal code and Reed-Solomon (RS) code as vertical code is described, and some of the advantages for this specific case are explained. FIG. 1 shows the managed memory, consisting of a 3 bit-per-cell flash memory die 103 and a single Flash Controller silicon die with two distinct areas 101 (Flash Read Channel) and 102 (actual Flash Controller).

Each block in the flash memory die is divided into 516 pages, and each page has capacity for 9216 bytes. The first 512 pages of each block will be used to store user information, and the last 4 pages will store the redundant bits introduced by the vertical code. Observe that the number of user information pages is a power of two, as is common practice in the industry.

We propose using an LDPC (Low Density Parity Check) code with 11% parity (1024 parity bytes per page) for the page-level encoding of the information pages and 6554 identical Reed-Solomon (RS) codes with 10 bits per symbol concatenated in parallel for the block-level encoding. The number of user information bits per page is not a multiple of 10, so for the purpose of the vertical encoding, four dummy zeros will be appended to the user information bits of each page. Each of the last 4 pages will therefore store 65540 parity bits from the RS codes, leaving only 8188 bits for the page-level code redundancy. Consequently, these pages cannot be encoded with the same LDPC code proposed above for the information pages, and a different LDPC code will be used. Another option that avoids using a different LDPC code for encoding of the vertical parity bits is to use an LDPC code that supports a slightly larger user length for information page encoding and perform shortening. Then, the same LDPC code can be used for encoding of both information and parity pages.

Figure 4:
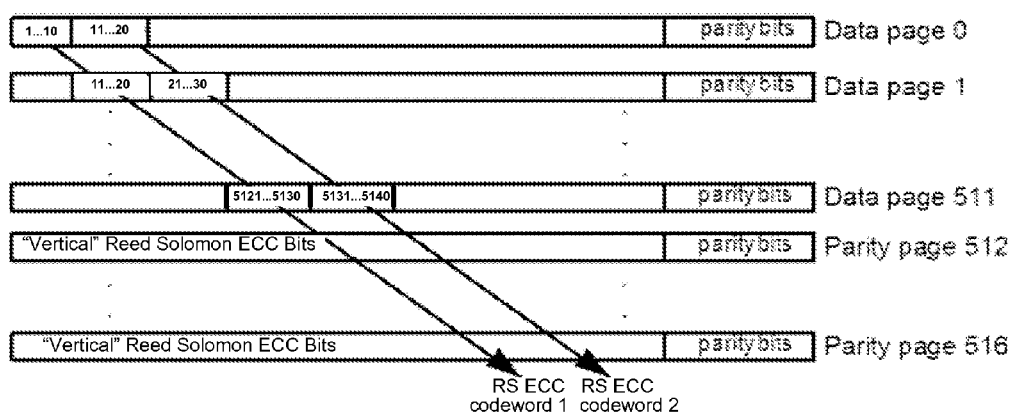
FIG. 4 illustrates an allocation of information and parity bits on a flash block and a mapping of the bits to codewords, as proposed in the detailed description of the invention.

Each RS codeword takes 10 bits from each page, totaling 5120 bits of information from the first 512 pages in the block and saving 40 bits from the last 4 pages in the block for redundancy. The mapping of bits to RS codewords, as well as the location of information and parity bits, is shown in FIG. 4.

Figure 2:
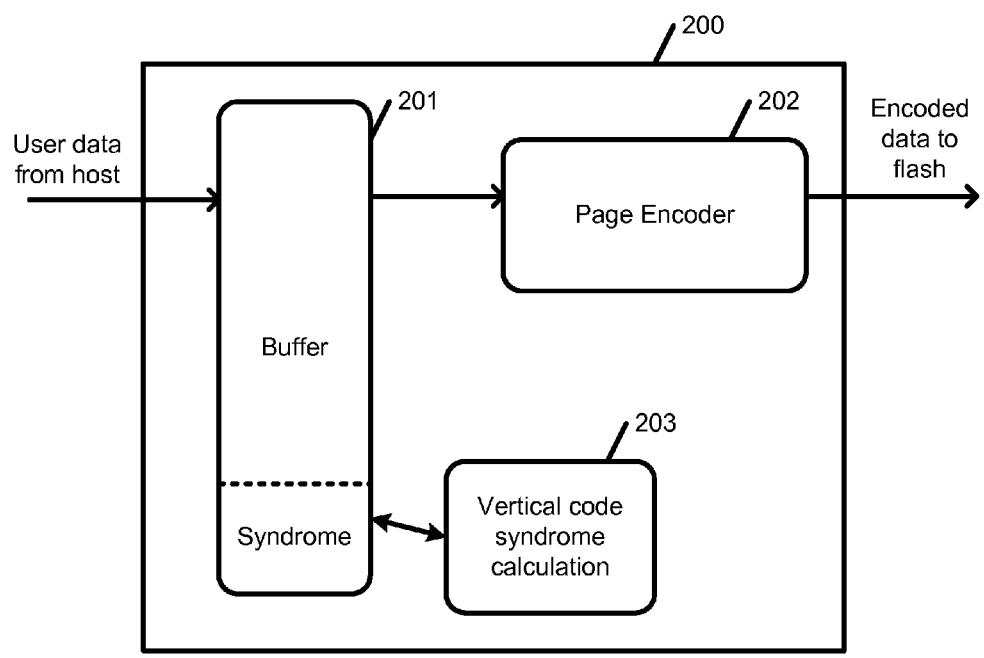
FIG. 2 is a diagram of the flash read channel where the low level controller is encoding user information and storing it on the flash.

The encoding and decoding procedure will now be described. FIG. 2 shows a block diagram of the flash read channel 101 acting as encoder. Block 200 is a more detailed block diagram of the read channel (block 101 in FIG. 1) during encoding. When the host sends new information to be written on the flash memory, the controller 102 temporarily stores the incoming bits in a random access memory buffer 201 before writing them on the flash. In most flash memory architectures, all the information bits to be written on a flash block are available at the buffer 201 before the block starts getting written. If this is the case, the RS encoding does not require any dedicated memory space, since the encoding can be done in-place at the buffer once the first four pages have been transferred to the flash. The information bits are first partitioned according to the RS codeword that they were mapped to and then each group is independently encoded. The RS encoding is done by computing the syndrome (redundant bits) as explained in Lin et al., supra, and saving it in the space released by the pages already transferred to the flash. Once all the syndromes have been computed, they can be written to the last 4 pages of the flash block.

If the architecture of the flash memory is such that a block can start being written before all its information bits are available in the buffer 201, the RS encoding will require 4 pages of dedicated buffer space to store the syndromes. The syndromes are computed as in the same way as in the previous case (as explained in [Lin, Costello]) but they need to be updated each time a new page is written on the flash block. Hence, four pages of buffer space are needed to store the provisional values for the syndromes. When all 512 information pages have arrived, the final value for the syndromes is known and can be written on the last 4 pages of the block. In the event of power loss before the block has been completely written, the syndromes would be lost (assuming the buffer was volatile). In this case, they can be recomputed by reading all the previous pages on the block.

Finally, the page level LDPC encoding is done by computing the redundant bits as explained in Thomas J. Richardson and Rudiger L. Urbanke, *Efficient Encoding of Low-Density Parity-Check Codes*, IEEE Transactions in Information Theory, 47(2), February 2001, and writing the whole codeword (information and redundant bits) to the corresponding page in the flash 103. Blocks 203 and 202 in FIG. 2 respectively represent the RS and LDPC encoders.

Figure 3:
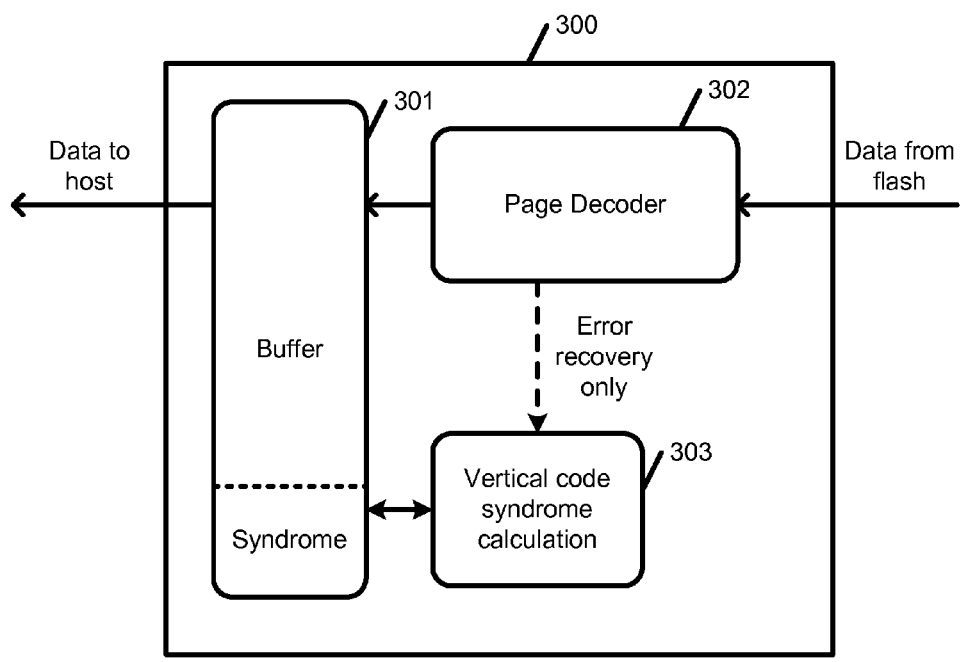
FIG. 3 is a diagram of the flash read channel where the low level controller is decoding data read from the flash and returning it to the user.

FIG. 3 shows a block diagram of the flash read channel 101 acting as decoder. Block 300 is a more detailed block diagram of the read channel during decoding. When the host requests information from the flash memory, the controller 102 reads the corresponding pages and passes the read values to the LDPC decoder 302. The LDPC decoder 302 translates the read values into bits, attempting to correct any errors that might have occurred (there are several different algorithms for doing this, see, for example, Xiao-Yu Hu, Eleftheriou, E., Arnold, D.-M., Dholakia, A., *Efficient implementations of the sum-product algorithm for decoding LDPC codes*, Global Telecommunications Conference, November 2001. In most cases, the LDPC decoder succeeds and the vertical RS encoding is ignored.

In the rare cases in which the LDPC decoder 302 cannot recover the originally written bits, the controller 102 reads all the other pages in the block, decoding each of them in turn and computing their contribution to the RS residual in block 303. It is not necessary to store all these pages in the buffer 301, since only the residual is required for error correcting, see, for example, Lin et al., supra.

A Reed-Solomon code with four symbols of redundancy can correct up to four erroneous symbols, as long as their locations are known. Consequently, the suggested RS vertical encoding will always be able to correct blocks where the horizontal decoding failed for four or less pages. LDPC codes offer very high error correction capability in general, but they occasionally fail due to their error floor. By relying on the vertical encoding to correct those cases, a significantly higher reliability than most of the other coding schemes results, with a very small cost in terms of code rate.

Having thus described a preferred embodiment, it should be apparent to those skilled in the art that certain advantages of the described method and apparatus have been achieved. It should also be appreciated that various modifications, adaptations and alternative embodiments thereof may be made within the scope and spirit of the present invention. The invention is further defined by the following claims.

What is claimed is:

1. A memory system with error correction, the system comprising:
    a memory organized into physical rows and columns;
    a read/write channel encoder/decoder storing error correction code data;
    the error correction code data representing two independent error correction codes, a first error correction code in a horizontal (row) direction and a second error correction code in a vertical (column) direction;
    wherein the read/write channel encoder/decoder uses the horizontal direction error correction for error decoding;
    wherein the read/write channel encoder/decoder uses the vertical direction error correction for erasure correction decoding.

2. The system of claim 1, wherein the memory is a flash memory.

3. The system of claim 1, wherein horizontal direction decoding flags failed codeword bits/page bits with erasures.

4. The system of claim 1, wherein the vertical direction erasure correction decoding is performed on values obtained after horizontal direction errors decoding.

5. The system of claim 1, wherein an error floor of LDPC (Low Density Parity Check) codes when used in horizontal direction is mitigated by the vertical direction error correction code.

6. The system of claim 5, wherein an overall error correction performance of the system is calculated from a performance of the horizontal direction error correction code and erasure capability of the vertical direction error correction code.

7. The system of claim 1, wherein an LDPC (Low Density Parity Check) code used for the horizontal direction for information pages is different from vertical parity pages.

8. The system of claim 1, wherein the vertical error correction code is a Reed Solomon code.

9. The system of claim 1, wherein a Low Density Parity Check (LDPC) code is used for page-level encoding of the information pages and Reed-Solomon (RS) code is used for block-level encoding.

10. The system of claim 1, wherein the horizontal direction error correction code is a linear code.

11. The system of claim 1, wherein the vertical error correction code is a linear code.

12. The system of claim 1, wherein the read/write channel encoder/decoder includes a random memory access buffer for temporarily storing incoming data prior to encoding.

13. A memory system with error correction, the system comprising:
    a flash memory having physical rows and columns;
    a read/write channel receiving incoming user data;
    a first error correction code in a horizontal (row) direction and a second error correction code in a vertical (column) direction, the error correction codes being independent of each other;
    the incoming user data written into the memory in encoded form;
    wherein the horizontal direction error correction is used for error decoding;
    wherein the vertical direction error correction is used for erasure correction decoding.

14. A method of storing and recovering data in a memory with error correction, the method comprising:
    receiving data in a read/write channel encoder/decoder;
    encoding the received data using error correction code data representing two independent error correction codes, a first error correction code in a horizontal (row) direction and a second error correction code in a vertical (column) direction;
    writing the encoded data into the memory;
    reading the encoded data from the memory and using the horizontal direction error correction for error decoding; and
    using the vertical direction error correction for erasure correction decoding.

* * * * *